(12) United States Patent
Yamada et al.

(10) Patent No.: US 7,110,241 B2
(45) Date of Patent: Sep. 19, 2006

(54) SUBSTRATE

(75) Inventors: Akira Yamada, Tokyo (JP); Ayumi Nozaki, Tokyo (JP); Shu Yamashita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/902,157

(22) Filed: Jul. 30, 2004

(65) Prior Publication Data

US 2005/0205293 A1 Sep. 22, 2005

(30) Foreign Application Priority Data

Mar. 22, 2004 (JP) .............................. 2004-081934

(51) Int. Cl.
*H01G 4/32* (2006.01)

(52) U.S. Cl. .................. 361/311; 361/301.1; 361/303; 361/313; 361/321.2; 361/321.5

(58) Field of Classification Search ........ 361/311–313, 361/306.2, 301.4, 321.2, 301.1, 302–305, 361/321.5, 306.1, 306.3, 329–330; 438/393, 438/395; 257/295, 296
See application file for complete search history.

(56) References Cited

U.S. PATENT DOCUMENTS

| 4,078,980 | A | * | 3/1978 | Harris et al. ................. 205/717 |
| 4,268,849 | A | * | 5/1981 | Gray et al. .................. 257/745 |
| 4,601,424 | A | * | 7/1986 | Adwalpalker et al. ... 228/124.1 |
| 5,952,687 | A | * | 9/1999 | Kawakubo et al. ......... 257/296 |
| 6,524,946 | B1 | * | 2/2003 | Tanaka ........................ 438/637 |
| 6,791,196 | B1 | * | 9/2004 | Kwon et al. ................. 257/784 |
| 6,882,516 | B1 | * | 4/2005 | Baniecki et al. .......... 361/321.1 |
| 6,912,113 | B1 | * | 6/2005 | Kumar et al. ............. 361/301.4 |

FOREIGN PATENT DOCUMENTS

JP 3209793 9/1991

\* cited by examiner

*Primary Examiner*—Nguyen T. Ha
(74) *Attorney, Agent, or Firm*—Leydig, Voit & Mayer, Ltd.

(57) ABSTRACT

A substrate has a base, an intermediate layer, a conductive layer, and conductive films. The base is a ceramic insulator. The intermediate layer is on a main surface of the base. The conductive layer is on the intermediate layer. The conductive films are on the conductive layer, covering an exposed portion of the conductive layer.

17 Claims, 2 Drawing Sheets

F I G. 1
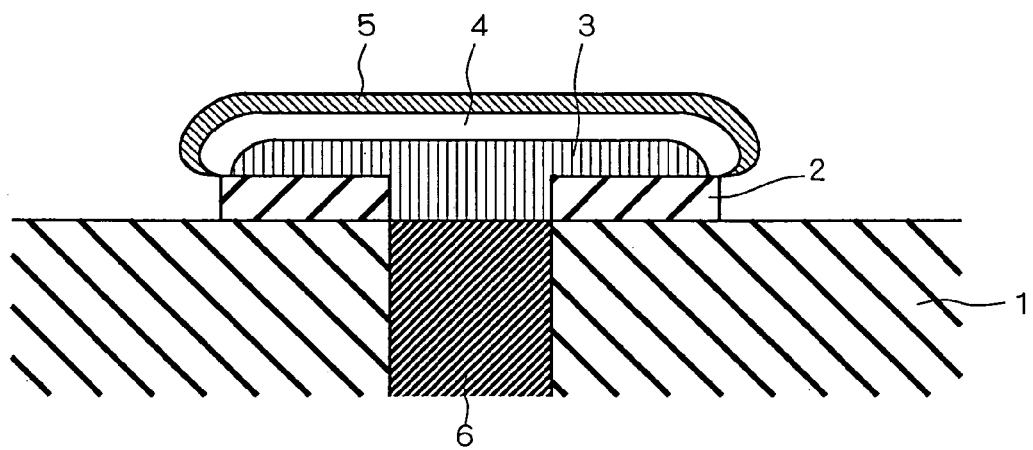
F I G. 2
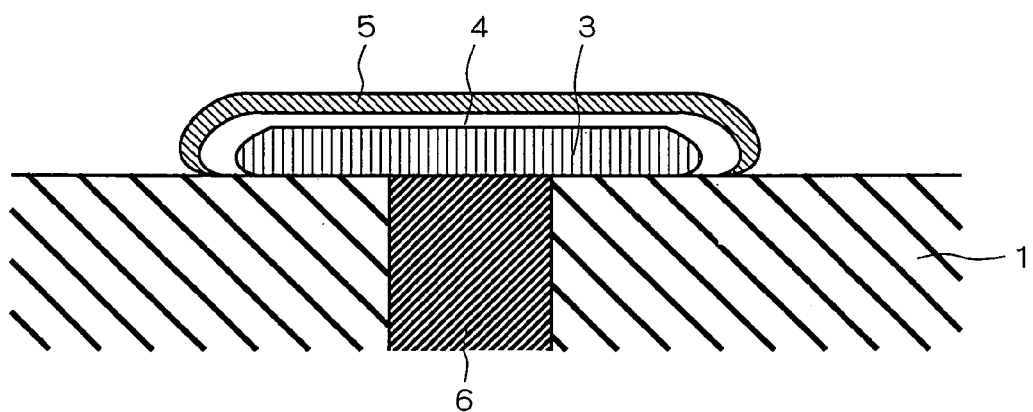

SUBSTRATE

BACKGROUND OF THE INVENTION

1. Field of the Invention

The present invention relates to a substrate having an insulating base and can be applied to, for example, a substrate having a ceramic or glass ceramic base.

2. Description of the Background Art

In wide-raging areas of technology such as information network, ceramic substrates and glass ceramic substrates are heavily used.

A ceramic substrate is a complex consisting of a ceramic base, a conductive portion, a plating film and the like. The conductive portion is formed on the ceramic base and the plating film is so formed as to cover the conductive portion. When the ceramic substrate having the above structure is manufactured, there is a case where part of the plating film is joined to an upper surface of the ceramic base.

When the ceramic substrate having the above structure is thermally treated with temperature changes, there is a case where cracks appear on the upper surface of the ceramic base near the conductive portion. This is caused by a large difference between the coefficient of thermal expansion of the plating film and that of the ceramic base.

Specifically, in the case where part of the plating film is joined to the ceramic base, when the ceramic substrate is thermally treated, a stress is produced between the plating film and the ceramic base due to the difference in coefficient of thermal expansion. Since the difference in coefficient of thermal expansion is large, the stress which is thereby produced becomes large and as a result, it causes cracks in the ceramic base.

For the purpose of suppressing occurrence of such cracks, there are techniques of changing manufacturing processes such as lowering the temperature for the thermal treatment and reducing the degree of temperature changes in the thermal treatment. There are other techniques of changing a pattern of the conductive portion, for example, by rounding corners of the conductive portion or reducing the density of formation in the conductive portion.

Patent Document 1, Japanese Patent Application Laid Open Gazette No. 3-209793, shows another technique in relation to the present invention.

In adopting the above techniques of changing the manufacturing processes, a free design of processes becomes impossible and moreover the process time becomes longer. As a result, due to the above problems in the manufacturing processes, the production efficiency of ceramic substrates becomes lower.

In adopting the above techniques of changing a pattern of the conductive portion, there arise problems of requiring a long time to change a design and increasing a manufacturing cost. Further, since there is no quantitative rule for design, the design change of the conductive portion is dependent only on experience. This requires setting of a larger design margin, resulting in lower efficiency of development.

Further, in order to reduce the stress applied onto the base, a method of reducing the thickness of nickel-plating film may be used. When components are soldered to the conductive portion, however, the nickel-plating film serves as a main junction layer. Therefore, in order to ensure good soldering, thinning of the nickel-plating film or simplification should not be easily made.

The cracks appearing in the upper surface of the ceramic base has an ill-effect on reliability and durability of the ceramic substrate. Therefore, suppressing occurrence of such cracks may allow significant cost reduction and contribute to an increase in fields of application.

SUMMARY OF THE INVENTION

It is an object of the present invention to provide a substrate capable of suppressing occurrence of cracks in an upper surface of a base while ensuring improvement of productivity and cost reduction.

According to the present invention, a substrate includes a base, an intermediate layer, a conductive portion and a conductive film. The base has insulating properties. The intermediate layer is formed on a main surface of the base. Further, the intermediate layer has insulating properties. The conductive portion is formed on the intermediate layer. The conductive film is formed on the conductive portion, covering an exposed portion of the conductive portion.

The present invention makes it possible to suppress direct joint of the conductive film onto the base. As a result, the amount of conductive film which is joined to the base becomes smaller than that in a substrate provided with no intermediate layer. Therefore, the stress caused on the base by the conductive film can be reduced. This reduction of stress makes it possible to suppress occurrence of cracks in the base. When the above aspect of the present invention is applied to a low-temperature sintered substrate having a base which includes glass, for example, the above-discussed effect becomes more noticeable.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an enlarged sectional view showing a structure of a substrate in accordance with a first preferred embodiment;

FIG. 2 is an enlarged sectional view showing a structure of a background-art substrate in relation to the technique of the preferred embodiment;

DESCRIPTION OF THE PREFERRED EMBODIMENTS

Figure 3:
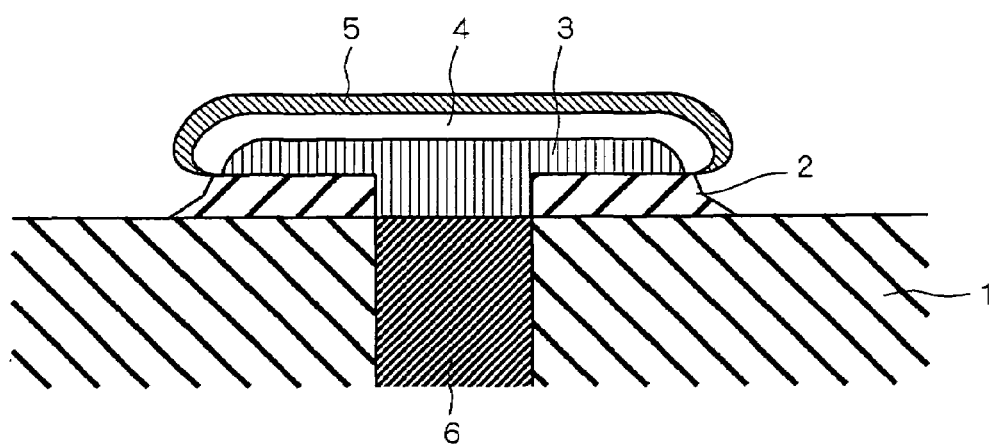
FIG. 3 is an enlarged sectional view showing a structure of a substrate in accordance with a second preferred embodiment.

Hereinafter, specific discussion will be made on the present invention on the basis of figures showing preferred embodiments thereof.

<The First Preferred Embodiment>

FIG. 1 is a sectional view showing a structure of a glass ceramic substrate in accordance with the first preferred embodiment. More specifically, FIG. 1 is an enlarged sectional view showing a conductive portion 3 on which plating films 4 and 5 are formed and its vicinity.

As shown in FIG. 1, the glass ceramic substrate is a complex consisting of a base 1 formed of glass and ceramic (e.g., alumina and aluminum nitride, or the like), an intermediate layer 2, a conductive portion 3 and plating films 4 and 5.

Specifically, the intermediate layer 2 is formed into a convex shape on a main surface of the base 1. On the intermediate layer 2, the conductive portion 3 is formed. A nickel-plating film 4 and a gold-plating film 5 are formed on the conductive portion 3 in this order, covering the conductive portion 3. Further, a through hole is opened through the base 1 and the intermediate layer 2 and in the through hole, a via 6 is formed. The via 6 is connected to the conductive portion 3.

The base 1 has relatively high mechanical strength. The intermediate layer 2 is an insulator and has a thickness of $1 \times 10^{-6}$ m (of the order of μm) or more. The intermediate layer 2 has a section of rectangle in this preferred embodiment. The conductive portion 3 is a metal such as silver, silver-palladium, copper or gold. The two-dimensional size of the intermediate layer 2 in a horizontal direction is not smaller than that of the conductive portion 3.

The conductive portion 3, the nickel-plating film 4 and the gold-plating film 5 constitute an electrode portion. Components are soldered to the electrode portion. The nickel-plating film 4 is provided to ensure better soldering of the components to the conductive portion 3. The gold-plating film 5 is provided for the purpose of protection of the nickel-plating film 4 from oxidation, or the like. Through soldering of the components to the electrode portion, the gold-plating film 5 is fused.

Next, discussion will be made on a method of manufacturing the glass ceramic substrate having the above structure.

First, powder-type borosilicate Al composited glass is prepared. The softening temperature of the borosilicate Al composited glass is about 870° C. The central particle diameter of the glass powder is about 2.5 μm.

Next, powder-type alumina which is commercially available is prepared. The average central particle diameter of this alumina is about 2.0 μm.

Subsequently, organic components for sheeting (a polyvinyl butyral resin, triolein as a dispersant, dibutyl phthalate as a plasticizer and a mixture of toluene and ethanol in proportions of 7:3 as a solvent) are added to the inorganic powders consisting of glass powders and alumina powders in equal weight to glass powders, and the organic components and the inorganic powders are mixed in a ball mill for 24 hours.

Amounts of respective organic components are as follows. Where the inorganic powers are 100, the polyvinyl butyral resin is 8.5, the triolein is 0.8, the dibutyl phthalate is 2.5, and the mixture of toluene and ethanol in proportions of 7:3 is 70.

The above mixed slurry is passed through a mesh. The slurry passed through the mesh is agitated and retained at reduced pressure. This allows bubbles and redundant solvents mixed in the slurry to be cleared. The viscosity of the slurry through the above processing is about 3000 cP.

Next, at the point of time when the temperature of the slurry becomes almost the room temperature, the slurry is formed into a tape-like shape having a thickness of about 100 μm on a PET (polyethylene terephthalate) film by the doctor blade method. After that, the tape-like slurry is predried at a temperature of 60° C. and regularly dried at a temperature of 100° C. and then cut into 100 mm squares each of which is used as the base 1.

After forming the base 1, a plurality of through holes each having a diameter of about 150 μm are opened in the base 1 by a multistylus-type sheet punching machine. Next, the through holes are filled with mixed powder conductors by printing. Through this filling, vias 6 are formed in the base 1. As the mixed conductive powders for filling, a mixture of, e.g., Ag (90%) and Pd (10%) can be adopted.

A circuit pattern is formed by printing on one of surfaces of the base. In FIG. 1, this base is not shown. The circuit pattern has a plurality of pad portions (each pad portion has a size of 250 μm×200 μm) and the pad portions are connected to the vias 6, respectively. The material of the circuit pattern is the same as that of the via 6.

Then, seven bases 1 through the above processing are manufactured. Further, one base 1 provided with the vias 6 and no circuit pattern is manufactured.

Next, the above eight bases 1 are so layered as to connect the respective vias 6 in the bases 1 to one another. The uppermost base 1 is the base 1 having only the vias 6. Positioning of the bases 1 is made with, e.g., positioning pins. FIG. 1 shows only the uppermost base 1. In this stage, the constituent elements (the intermediate layer 2, the vias 6 in the intermediate layer 2, the conductive portion 3, the plating films 4 and 5) above the base 1 of FIG. 1 are not formed yet.

The layered bases 1 are pressed by a hydrostatic pressing machine to unite the eight bases 1. Pressing is performed under the condition where the pressing temperature is 80° C., the pressure is 300 Kg/cm$^2$ and the pressing time is 10 minutes.

Next, the intermediate layer 2 is patterned on the uppermost base 1 by the screen printing method. The pattern of the intermediate layer 2 is the same as the circuit pattern (the conductive portion 3) to be formed later. The two-dimensional size, however, of the intermediate layer 2 in a horizontal direction is not smaller than that of the circuit pattern (the conductive portion 3). Further, the pattern of the intermediate layer 2 is provided with such holes as to expose the vias 6 formed in the uppermost base 1.

A paste used for forming the intermediate layer 2 is a mixture of alumina powders and glass powders in equal proportion to that of base 1. The paste used for forming the intermediate layer 2 is different from the slurry of the base 1 in the following point.

Specifically, the above paste uses an ethylcellulose resin as an bonding agent, instead of a polyvinyl butyral resin. Further, polypropylene glycol is added in order to control printing performance. The amount of solvents is controlled in order to increase the viscosity for printing and as a result, the viscosity of the above paste becomes about 600000 cP.

Next, after the paste is dried at a temperature of 80° C., the circuit pattern (the conductive portion 3) is formed on the intermediate layer 2 by the screen printing method. In forming the circuit pattern (the conductive portion 3), the holes formed in the intermediate layer 2 are also filled with conductors.

The circuit pattern formed on the intermediate layer 2 and the vias 6 formed in the uppermost base 1 are thereby connected to each other. As a material of the circuit pattern, mixed conductive powders consisting of, e.g., Ag (90%) and Pd (10%) can be adopted.

The layered body of bases 1 which is obtained through the above process steps is heated up to about 500° C. The organic component contained in the layered body is decomposed and cleared through this heating at about 500° C.

The layered body is heated at a temperature of about 900° C. for about one hour. Through this heating at about 900° C., the layered body becomes a dense sintered body. Further, in order to improve adherence of the circuit pattern (the conductive portion 3) to the intermediate layer 2, hydrostatic forming may be performed again on the layered body which has become the dense sintered body.

Next, electroless plating is performed on the layered body which has become the dense sintered body. Through this electroless plating, the nickel-plating film 4 and the gold-plating film 5 are formed on the circuit pattern (the conductive portion 3). The nickel-plating film 4 has a thickness of about 10 μm and the gold-plating film 5 has a thickness of about 0.3 μm.

The layered body after being plated is heated up to about 300° C. for about 10 minutes.

Through the above process steps, the substrate of FIG. 1 is manufactured.

In the substrate of the first preferred embodiment, the intermediate layer 2 which is an insulator having a predetermined thickness between the base 1 and the conductive portion 3.

This suppresses excessive joint between part of the plating films 4 and 5 formed on the conductive portion 3 and the base 1. In other words, the present invention makes it possible to suppress joint between the plating films 4 and 5 and the base 1 (to prevent the plating films 4 and 5 from excessively adhering to the base 1), instead of additionally providing a stress alleviator between the base 1 and the plating films 4 and 5.

In the background-art substrate, as shown in FIG. 2, the conductive portion 3 is formed directly on the base 1. Therefore, as shown in FIG. 2, parts of the plating films 4 and 5 are excessively joined to the base 1 near end portions of the conductive portion 3.

In the substrate of the first preferred embodiment, however, since the intermediate layer 2 is provided, it is possible to prevent parts of the plating films 4 and 5 from reaching (joining to) the base 1.

Suppressing joint between the plating films 4 and 5 and the base 1 produces the following effects.

Specifically, when the substrate of FIG. 2 is heated after plating, cracks sometimes appears in the base 1 near the end portions of the conductive portion 3. This is caused by a large stress produced in the base 1 to which the plating films 4 and 5 are joined (due to difference in coefficient of thermal expansion between the base 1 and the plating films 4 and 5).

In the substrate of the first preferred embodiment, however, since the plating films 4 and 5 are not excessively joined to the base 1, it is possible to suppress occurrence of cracks in the base 1.

Further, the substrate of the first preferred embodiment is subjected to a thermal shock test. Then, the base 1 on which the intermediate layer 2 is formed and its vicinity are observed. In the test, the intermediate layer 2 has a thickness of about 5 to 10 μm.

It is found from this observation that the number of cracks appearing in the base 1 provided with the intermediate layer 2 is not larger than half that in the base 1 provided with no intermediate layer 2. It is also found that the depth of cracks in the base 1 provided with the intermediate layer 2 is shallower than that in the base 1 provided with no intermediate layer 2.

From the result of the above test, it is clear that adopting the substrate of the first preferred embodiment should make it possible to suppress occurrence of cracks in the base 1.

The material of the intermediate layer 2 needs insulating properties. That is because if the intermediate layer 2 has conductive properties, the plating films 4 and 5 are formed also on the intermediate layer 2. In such a case, the effect of suppressing joint between the base 1 and the plating films 4 and 5 is reduced.

If the two-dimensional size of the intermediate layer 2 in a horizontal direction is smaller than that of the circuit pattern (the conductive portion 3), part of the circuit pattern (the conductive portion 3) is joined to the base 1. In this state, when plating is performed, the plating films 4 and 5 are excessively joined to the base 1.

Therefore, it is necessary to set the two-dimensional size of the intermediate layer 2 in a horizontal direction not smaller than that of the circuit pattern (the conductive portion 3). This makes it possible to suppress excessive joint between the plating films 4 and 5 and the base 1.

Further, it is verified that by setting the thickness of the intermediate layer 2 not smaller than $1 \times 10^{-6}$ m (of the order of μm), the effect of suppressing excessive joint between the plating films 4 and 5 and the base 1 becomes more noticeable.

The material of the intermediate layer 2 may be the same as that of the base 1. It is preferable, however, that a material having high resistance to plating solution with excellent acid resistance and alkali resistance should be adopted. This aims to prevent erosion of the intermediate layer 2 by the plating solution.

Further, it is preferable that for the intermediate layer 2, a material having the property of being densified at the temperature for densification of the base 1 or lower should be adopted. That is because if the base 1 and the intermediate layer 2 are densified at the same time, there is a possibility to cause a case where the base 1 is densified and the intermediate layer 2 is not sufficiently densified.

When the densification of the intermediate layer 2 is insufficient, the plating solution remains in the intermediate layer 2. The residue of plating solution in the intermediate layer 2 may cause foreign materials to be deposited in the intermediate layer 2 and lead to a decrease in strength of the intermediate layer 2. Further, this leads to a decrease in strength of adherence between the intermediate layer 2 and the conductive portion 3.

The intermediate layer 2 may contain alumina as a filler, like the base 1. Further, the intermediate layer 2 may contain at least one of aluminum nitride, silicon nitride, fused quartz, mullite, aluminum oxide and silicon oxide as a filler.

With these materials contained in the intermediate layer 2, the thermal conductivity of the intermediate layer 2 becomes higher than that of the intermediate layer 2 containing alumina. Therefore, even if a current flows in the conductive portion 3 and the temperature of the conductive portion 3 increases, it becomes easier to dissipate the heat to the base 1 through the intermediate layer 2.

Further, as the intermediate layer 2, a material having a dielectric loss lower than that of the base 1 may be adopted. That is because if a high-frequency voltage is applied to the conductive portion 3, for example, the power loss of the conductive portion 3 decreases.

The power loss of the conductive portion 3 depends on the resistance of the conductive portion 3 and the dielectric loss of a base portion (including the base 1 and the intermediate layer 2). As the resistance of the conductive portion 3 and the dielectric loss of the base portion are smaller, the power loss of the conductive portion 3 becomes smaller. Therefore, by adopting a material having low dielectric loss as the intermediate layer 2, the power loss of the conductive portion 3 decreases as compared with the case where the intermediate layer 2 is formed of the same material as the base 1.

Further, as the intermediate layer 2, a material having a coefficient of thermal expansion between that of the base 1 and that of the plating films 4 and 5 may be adopted. That is because this can suppress a thermal stress produced in the intermediate layer 2 due to presence of the plating films 4 and 5. Especially, when the nickel-plating film 4 is excessively deposited on the intermediate layer 2 due to variation of process conditions, adopting the material having such a coefficient of thermal expansion as above as the intermediate layer 2 works as an effective method of suppressing a stress.

In order to effectively prevent the plating films 4 and 5 from reaching (joining to) the base 1, it is necessary to position the conductive portion 3 higher than the original level of the base 1. Therefore, it is necessary to position an upper surface of the intermediate layer 2 higher than the original level of the base 1.

Further, there is no need to particularly limit a method of forming the intermediate layer 2. By adopting the printing method using a mesh screen, however, formation of the intermediate layer 2 becomes easier and the manufacturing cost becomes lower. For formation of the intermediate layer 2, a method of layering a plurality of thin-film layers may be adopted. This method, however, needs some contrivance in manufacturing precision and the number of process steps.

<The Second Preferred Embodiment>

FIG. 3 is an enlarged sectional view showing a structure of a substrate in accordance with the second preferred embodiment. The structure of FIG. 3 is almost the same as that of FIG. 1 but different therefrom in the following point.

Specifically, in the substrate of the first preferred embodiment, the intermediate layer 2 is formed so that its side surface should be substantially perpendicular to the base 1 (in other words, the intermediate layer 2 has a rectangular section) (see FIG. 1). In the substrate of the second preferred embodiment, however, the intermediate layer 2 has a divergent section. The sectional shape of the intermediate layer 2 may be a trapezoid but is not limited to that.

The structure of constituent elements other than the intermediate layer 2 (i.e., the base 1, the conductive portion 3, the plating films 4 and 5, the via 6 and the like) is the same as that in the first preferred embodiment and will not be discussed herein.

On the base 1, a paste is printed to form the intermediate layer 2 having a predetermined pattern. The intermediate layer 2 having a side surface of divergent shape can be formed by, e.g., controlling the components of the paste.

Specifically, though the amount of glass in the paste is the same as that in the base 1 in the first preferred embodiment, the amount of glass in the paste is increased to be larger than that in the base 1 by 20% in the second preferred embodiment. In other words, in the second preferred embodiment, the amount of glass in the paste is made larger than that in the base 1.

Glass is softened at the firing temperature to be fluid. Therefore, by increasing the glass component in the paste, the paste becomes more fluid than the base 1. Accordingly, by making the amount of glass in the paste larger than that in the base 1 as discussed above, the intermediate layer 2 has a side surface with a tilt which is divergent in a step of firing the printed paste.

The process steps of manufacturing the substrate other than the above-discussed step are performed like in the first preferred embodiment.

In the above discussion, the side surface of the intermediate layer 2 is made divergent by increasing the about of glass component in the intermediate layer 2. The method of obtaining the divergent side surface of the intermediate layer 2, however, is not limited to that.

For example, a formation region of the intermediate layer 2 is made slightly larger than the circuit pattern (the conductive portion 3) to be formed later. Then, the circuit pattern (the conductive portion 3) is layered on the intermediate layer 2. After that, a relatively thick surface protective sheet of the base 1 is put on a surface on which the conductive portion 3 and the like are formed. In this state, hydrostatic pressing is performed on the base 1.

Then, part of the intermediate layer 2 which extends off the circuit pattern (the conductive portion 3) is pressed by the surface protective sheet and the side surface of the intermediate layer 2 thereby becomes divergent.

Thus, the structure of the second preferred embodiment may be mechanically formed.

As discussed above, in the substrate of the second preferred embodiment, the intermediate layer 2 has the side surface with a tilt which is divergent. Therefore, as compared with the substrate of the first preferred embodiment, it becomes possible to more reliably prevent the plating films 4 and 5 from reaching (joining to) the base 1.

Further, the substrate of the second preferred embodiment is also subjected to the thermal shock test, like in the first preferred embodiment. Then, the base 1 on which the intermediate layer 2 is formed and its vicinity are observed. In the test, the intermediate layer 2 has a thickness of about 5 to 10 μm.

It is found from this observation that the number of cracks appearing in the base 1 becomes smaller that in the substrate of the first preferred embodiment. It is also found that the depth of cracks in the base 1 is shallower than that in the first preferred embodiment.

Further, by making the amount of glass component in the intermediate layer 2 larger than that in the base 1, the second preferred embodiment produces an effect of improving adherence between the intermediate layer 2 and the base 1 after sintering.

<The Third Preferred Embodiment>

Figure 4:
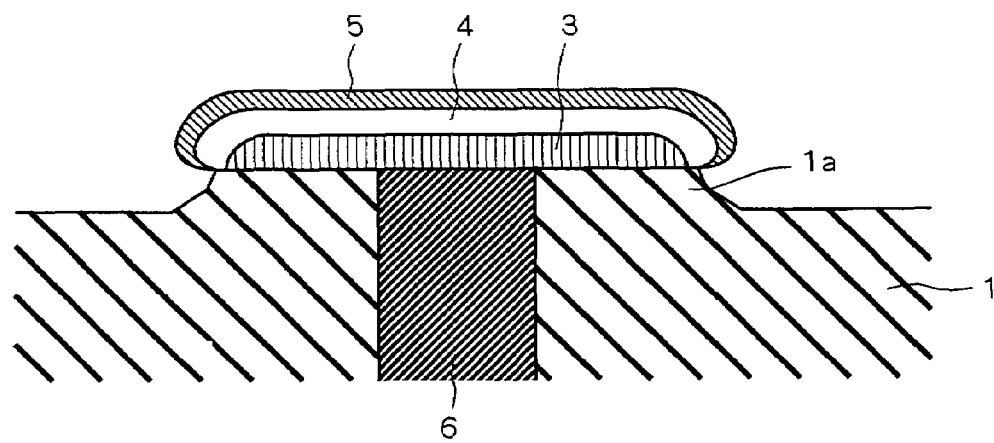
FIG. 4 is an enlarged sectional view showing a structure of a substrate in accordance with a third preferred embodiment.

FIG. 4 is an enlarged sectional view showing a structure of a substrate in accordance with the third preferred embodiment. The structure of FIG. 4 is almost the same as that of FIG. 3 but different therefrom in the following point.

In the substrate of the second preferred embodiment, the base 1 and the intermediate layer 2 are formed independently from each other. In the substrate of the third preferred embodiment, however, the base and intermediate layer are united. Specifically, in forming the base 1, a convex portion 1a having a predetermined thickness is provided with respect to the base 1. The convex portion 1a serves as an intermediate layer.

For forming the convex portion 1a in the base 1, there is the following method, for example.

Like in the first preferred embodiment, a plurality of bases 1 are prepared. Further, in the third preferred embodiment, a metal plate is prepared. The metal plate has a concave portion of the same pattern as the circuit pattern (the conductive portion 3) to be formed later. The concave portion can be formed by half-etching of the metal plate, for example. The concave portion has a depth of about 15 μm.

Next, eight bases 1 are layered. In this case, as discussed in the first preferred embodiment, no circuit pattern (conductive portion 3) is formed on the uppermost base 1.

Subsequently, the metal plate is put on the layered body of bases 1. At this time, the uppermost base 1 faces the concave portion formed on the metal plate. Positioning of the metal plate on the uppermost base 1 can be performed by adopting positioning pins.

Next, like in the first preferred embodiment, hydrostatic pressing is performed on the metal plate and the layered body of bases 1 which are layered. Through this pressing, on an upper surface of the uppermost base 1 formed is a convex portion of the same pattern as the circuit pattern (the conductive portion 3) to be formed later.

The process steps of manufacturing the substrate other than the above-discussed step are performed like in the first preferred embodiment.

Further, the substrate of the third preferred embodiment is also subjected to the thermal shock test, like in other preferred embodiments. As the result of test, it is found that the substrate of the third preferred embodiment produces an effect of suppressing occurrence cracks in the base 1, like those in other preferred embodiments.

In FIG. 4, a side surface of the convex portion 1a is divergent. The side surface of the convex portion 1a, however, may have a rectangular section like the side surface of the intermediate layer 2 of the first preferred embodiment. In the case of adopting the metal plate for formation of the convex portion 1a, the side surface shape of the convex portion 1a of the base 1 can be arbitrarily changed by appropriately changing the side surface shape of the concave portion formed in the metal plate.

Further, in the case where the concave portion of the metal plate has a rectangular section, the convex portion 1a of the base 1 also has a rectangular section. Also by firing the base 1 provided with the convex portion 1a, it is possible to make the side surface of the convex portion 1a divergent.

In the above-discussed preferred embodiments, the base 1 is a glass ceramic base. The base 1, however, is not limited to the glass ceramic base but has only to have insulating properties. For example, the base 1 may be a ceramic base or an organic base.

The present invention, however, is more effective in the case of substrate manufactured through low-temperature firing, which has the base 1 containing glass.

That is because the coefficient of thermal expansion of the base 1 containing glass is smaller than that of base 1 not containing glass, such as an organic base 1. Therefore, the difference in coefficient of thermal expansion between the base 1 and the plating films 4 and 5 becomes more noticeable. The more noticeable difference in coefficient of thermal expansion more easily causes a stress in the base 1. Accordingly, the base 1 containing glass more needs to suppress joint with the plating films 4 and 5 and the present invention thereby becomes more effective.

Further, when the substrate of the first or second preferred embodiment adopts the base 1 containing glass, the following effect can be also produced. Specifically, the glass in the base 1 is fused in densification of the base 1 and the like by firing. After that, as the temperature decreases, the glass is solidified again. The resolidification of glass also occurs in a junction surface between the base 1 and the intermediate layer 2, and through this resolidification, the bonding strength between the base 1 and the intermediate layer 2 increases.

Therefore, by adopting the base 1 containing glass, it becomes possible to strongly bond the base 1 and the intermediate layer 2 through a relatively simple process (the above densification by firing).

When a via 6 which passes through the base 1 and is connected to the conductive portion 3 formed on the intermediate layer 2 is formed, a further stress is applied to the base 1 due to presence of the via 6.

Therefore, when the base has the via 6, it becomes more important to decrease a factor causing the stress. In this case, adopting the substrate of the present invention is more effective.

In the above-discussed preferred embodiments, as the plating film, the nickel-plating film 4 and the gold-plating film 5 are adopted. The plating film is not limited to those but even other metal-plating film can produce the same effect.

In general, the present invention is more effective as the plating film has higher stiffness or is thicker.

In the above-discussed preferred embodiments, the structures provided with the plating films are shown. Even in a case where a film like the plating film is formed on the conductive portion 3 by a method other than plating (e.g., vapor deposition, sputtering or the like), the same effect can be produced.

While the invention has been shown and described in detail, the foregoing description is in all aspects illustrative and not restrictive. It is therefore understood that numerous modifications and variations can be devised without departing from the scope of the invention.

What is claimed is:

1. A substrate comprising:
   a ceramic insulating base;
   an intermediate layer having insulating properties, on a main surface of said base;
   a conductive portion on and in contact with said intermediate layer; and
   a conductive film on and in contact with said conductive portion, covering an exposed portion of said conductive portion.

2. The substrate according to claim 1, wherein said intermediate layer has a thickness of at least 1 micron.

3. The substrate according to claim 1, wherein said intermediate layer contains an insulating material which is a constituent element of said base.

4. The substrate according to claim 1, wherein said intermediate layer is resistant to a plating solution used to deposit the conductive portion.

5. The substrate according to claim 1, wherein said base and said intermediate layer have respective densification temperatures and the densification temperature of said intermediate layer is not higher than the densification temperature of said base.

6. The substrate according to claim 1, wherein said intermediate layer contains at least one of aluminum nitride, silicon nitride, fused quartz, mullite, aluminum oxides and silicon oxide.

7. The substrate according to claim 1, wherein said intermediate layer and said base have respective dielectric loss constants and the dielectric loss constant of said intermediate layer is lower than the dielectric loss constant of said base.

8. The substrate according to claim 1, wherein said base, said intermediate layer, and said conductive film have respective coefficients of linear expansion and the coefficient of linear expansion of said intermediate layer is intermediate the coefficients of linear expansion of said base and of said conductive film.

9. The substrate according to claim 1, wherein said intermediate layer is one piece with said base.

10. The substrate according to claim 1, wherein said intermediate layer covers a first area on the main surface of said base and said conductive portion covers a second area over the main surface of said base and the first area is not smaller than the second area.

11. The substrate according to claim 1, wherein said intermediate layer has a shape, in a cross-section perpendicular to the main surface of said base, that is at least partially oblique to the main surface of said base.

12. The substrate according to claim 1, further comprising:
   a first hole in said insulating base extending to the main surface and filled with a conductor; and
   a second hole in said intermediate layer and connecting with said first hole, wherein said conductive portion fills said second hole and contacts said conductor.

13. A substrate comprising:
   an electrically insulating base;
   an electrically insulating intermediate layer on a main surface of said base;
   a conductive layer on and in contact with said intermediate layer and having a peripheral portion located entirely on said intermediate layer; and
   a conductive film covering said conductive layer, including said peripheral portion of said conductive layer, and extending to and in contact with said intermediate layer, but not contacting said base.

14. The contact structure according to claim 13, wherein said base, said intermediate layer, and said conductive film have respective coefficients of linear expansion and the coefficient of linear expansion of said intermediate layer is intermediate the coefficients of linear expansion of said base and of said conductive film.

15. A substrate comprising:
   an insulating base having a convex portion projecting from a main surface of said base;
   a conductive portion on and in contact with said convex portion; and
   a conductive film on and in contact with said conductive portion, covering an exposed portion of said conductive portion.

16. The substrate according to claim 13, further comprising:
   a first hole in said insulating base extending to the main surface and filled with a conductor; and
   a second hole in said intermediate layer and connecting with said first hole, wherein said conductive portion fills said second hole and contacts said conductor.

17. The substrate according to claim 15, further comprising a hole in said insulating base extending through the convex portion and filled with a conductor contacting said conductive portion.

* * * * *